United States Patent
Chen et al.

(10) Patent No.: US 8,503,178 B2
(45) Date of Patent: Aug. 6, 2013

(54) HEAT EXCHANGE DEVICE AND CLOSED-TYPE ELECTRONIC APPARATUS USING THE SAME

(75) Inventors: Lee-Long Chen, Taoyuan Hsien (TW); Chien-Hsiung Huang, Taoyuan Hsien (TW); Ya-Sen Tu, Taoyuan Hsien (TW)

(73) Assignee: Delta Electronics, Inc., Kuei San, Taoyuan Hsien (TW)

( * ) Notice: Subject to any disclaimer, the term of this patent is extended or adjusted under 35 U.S.C. 154(b) by 216 days.

(21) Appl. No.: 12/950,497

(22) Filed: Nov. 19, 2010

(65) Prior Publication Data

US 2011/0122581 A1    May 26, 2011

(30) Foreign Application Priority Data

Nov. 20, 2009   (TW) .............................. 98139633 A

(51) Int. Cl.
*H05K 7/20*   (2006.01)
(52) U.S. Cl.
USPC ...... 361/696; 361/692; 361/695; 361/679.48; 361/679.49; 454/184; 454/186
(58) Field of Classification Search
USPC ............... 454/184, 186; 361/679.53, 687, 361/679.51, 679.5, 692, 694, 695, 679.48, 361/679.49, 696; 61/695
See application file for complete search history.

(56) References Cited

U.S. PATENT DOCUMENTS

| | | | | |
|---|---|---|---|---|
| 2,459,322 A * | 1/1949 | Johnston | ......................... | 336/57 |
| 2,824,939 A * | 2/1958 | Claybourn et al. | ........... | 200/289 |
| 3,807,493 A * | 4/1974 | Stewart | .................... | 165/104.14 |
| 4,333,520 A * | 6/1982 | Yanadori et al. | ................. | 165/59 |
| 4,365,666 A * | 12/1982 | Seifert | ..................... | 165/104.29 |
| 4,386,651 A * | 6/1983 | Reinhard | ................. | 165/104.33 |
| 4,449,579 A * | 5/1984 | Miyazaki et al. | ........ | 165/104.33 |
| 4,600,050 A * | 7/1986 | Noren | ...................... | 165/104.14 |
| 4,665,466 A * | 5/1987 | Green | ......................... | 361/696 |
| 4,706,739 A * | 11/1987 | Noren | ...................... | 165/104.14 |
| 5,035,281 A * | 7/1991 | Neuenfeldt et al. | ............ | 165/76 |
| 5,168,171 A * | 12/1992 | Tracewell | ........................ | 307/64 |
| 5,339,221 A * | 8/1994 | Conroy-Wass et al. | ........ | 361/796 |
| 5,738,166 A * | 4/1998 | Chou | ........................ | 165/104.21 |
| 5,806,583 A * | 9/1998 | Suzuki et al. | ........... | 165/104.33 |
| 5,878,808 A * | 3/1999 | Rock et al. | ....................... | 165/85 |
| 5,914,858 A * | 6/1999 | McKeen et al. | ............... | 361/695 |
| 6,026,891 A * | 2/2000 | Fujiyoshi et al. | ........ | 165/104.33 |
| 6,039,111 A * | 3/2000 | Kawaguchi et al. | ..... | 165/104.14 |
| 6,131,647 A * | 10/2000 | Suzuki et al. | ........... | 165/104.33 |
| 6,164,369 A * | 12/2000 | Stoller | ..................... | 165/104.33 |
| 6,382,308 B2 * | 5/2002 | Okamoto | ................. | 165/104.21 |
| 6,480,379 B1 * | 11/2002 | Dickey et al. | ............ | 361/679.51 |
| 6,575,230 B1 * | 6/2003 | Kadota et al. | ............ | 165/104.33 |
| 6,876,549 B2 * | 4/2005 | Beitelmal et al. | ............. | 361/692 |

(Continued)

FOREIGN PATENT DOCUMENTS

TW     M295285 U    8/2006

*Primary Examiner* — Anatoly Vortman
(74) *Attorney, Agent, or Firm* — Muncy, Geissler, Olds & Lowe, PLLC

(57) ABSTRACT

A heat exchange device includes a housing, an internal circulating fan, an external circulating fan and a heat exchange unit. The internal and external circulating fans and the heat exchange unit are disposed in the housing. The internal and external circulating fans are disposed at the same side relative to the heat exchange unit. A closed-type electronic apparatus including the heat exchange device is also disclosed.

28 Claims, 8 Drawing Sheets

(56) References Cited

U.S. PATENT DOCUMENTS

| | | | | |
|---|---|---|---|---|
| 6,877,551 | B2* | 4/2005 | Stoller | 165/47 |
| 6,924,981 | B2* | 8/2005 | Chu et al. | 361/696 |
| 6,927,980 | B2* | 8/2005 | Fukuda et al. | 361/700 |
| 6,961,242 | B2* | 11/2005 | Espinoza-Ibarra et al. | 361/695 |
| 6,987,673 | B1* | 1/2006 | French et al. | 361/727 |
| 7,016,191 | B2* | 3/2006 | Miyamoto et al. | 361/679.33 |
| 7,042,720 | B1* | 5/2006 | Konshak et al. | 361/679.33 |
| 7,054,155 | B1* | 5/2006 | Mease et al. | 361/695 |
| 7,139,170 | B2* | 11/2006 | Chikusa et al. | 361/695 |
| 7,154,748 | B2* | 12/2006 | Yamada | 361/690 |
| 7,158,378 | B2* | 1/2007 | Hinzpeter et al. | 361/695 |
| 7,187,547 | B1* | 3/2007 | French et al. | 361/679.33 |
| 7,190,576 | B2* | 3/2007 | Wang et al. | 361/679.47 |
| 7,215,552 | B2* | 5/2007 | Shipley et al. | 361/721 |
| 7,262,962 | B1* | 8/2007 | McLeod et al. | 361/679.48 |
| 7,295,442 | B2* | 11/2007 | Garnett et al. | 361/728 |
| 7,448,439 | B2* | 11/2008 | Hirafuji et al. | 165/135 |
| 7,558,056 | B2* | 7/2009 | Suzuki et al. | 361/679.49 |
| 7,631,687 | B2* | 12/2009 | Yang | 165/104.33 |
| 7,701,712 | B2* | 4/2010 | Kramer | 361/695 |
| 7,813,121 | B2* | 10/2010 | Bisson et al. | 361/679.51 |
| 7,903,403 | B2* | 3/2011 | Doll et al. | 361/679.5 |
| 7,916,471 | B2* | 3/2011 | Miyamoto et al. | 361/679.5 |
| 8,125,778 | B2* | 2/2012 | Miyoshi | 361/695 |
| 8,223,492 | B2* | 7/2012 | Ji et al. | 361/692 |
| 8,223,493 | B2* | 7/2012 | Ye | 361/695 |
| 2003/0053293 | A1* | 3/2003 | Beitelmal et al. | 361/687 |
| 2003/0094266 | A1* | 5/2003 | Fritsch | 165/135 |
| 2004/0109288 | A1* | 6/2004 | Beitelmal et al. | 361/687 |
| 2004/0264128 | A1* | 12/2004 | Crippen et al. | 361/687 |
| 2005/0061485 | A1* | 3/2005 | Hirafuji et al. | 165/104.21 |
| 2006/0176665 | A1* | 8/2006 | Matsushima et al. | 361/687 |
| 2007/0002536 | A1* | 1/2007 | Hall et al. | 361/695 |
| 2007/0169920 | A1* | 7/2007 | Yang | 165/104.34 |
| 2007/0195499 | A1 | 8/2007 | Chu | |
| 2007/0274039 | A1* | 11/2007 | Hamlin | 361/695 |
| 2008/0055846 | A1* | 3/2008 | Clidaras et al. | 361/687 |
| 2008/0094799 | A1* | 4/2008 | Zieman et al. | 361/695 |
| 2008/0113604 | A1* | 5/2008 | Tufford et al. | 454/187 |
| 2009/0056910 | A1* | 3/2009 | Mallia et al. | 165/80.3 |
| 2009/0059523 | A1* | 3/2009 | Mallia et al. | 361/695 |
| 2009/0196744 | A1* | 8/2009 | Yu et al. | 415/177 |
| 2009/0244842 | A1* | 10/2009 | Iwakiri | 361/695 |

* cited by examiner

HEAT EXCHANGE DEVICE AND CLOSED-TYPE ELECTRONIC APPARATUS USING THE SAME

CROSS REFERENCE TO RELATED APPLICATIONS

This Non-provisional application claims priority under 35 U.S.C. §119(a) on Patent Application No(s). 098139633 filed in Taiwan, Republic of China on Nov. 20, 2009, the entire contents of which are hereby incorporated by reference.

BACKGROUND OF THE INVENTION

1. Field of Invention

The present invention relates to a closed-type electronic apparatus and a heat exchange device thereof.

2. Related Art

As electronic products progress in their performances, they generate more and more heat in operation resulting in temperature increase. It severely jeopardizes the stability of the electronic products and, meanwhile, reduces their reliability and lifetime. Thus, the heat dissipation has become an important issue for the electronic products. Frequently, heat exchange devices are responsible to heat dissipation inside closed-type electronic apparatuses.

FIG. 1A is a decomposition figure of a conventional heat exchange device 1, and FIG. 1B is a laterally cross-sectional figure of the heat exchange device 1 shown in FIG. 1A. As shown in FIGS. 1A and 1B, the heat exchange device 1 includes an internal circulating fan 11, an external circulating fan 12 and a heat exchange unit 13, a housing 14 and a cover 15. With respect to the structure of the heat exchange device 1, the internal circulating fan 11, the external circulating fan 12 and the heat exchange unit 13 are disposed in the housing 14, and then the housing 14 is caped with the cover 15. In more detailed, the internal circulating fan 11 and the external circulating fan 12 are disposed at the top and the bottom of the heat exchange unit 13, respectively. Therefore, the hot air inside the closed-type electronic apparatus is inducted into the housing 14 in the direction $I_1$ when the internal circulating fan 12 is rotating, and, meanwhile, the outside cold air is also inducted into the housing 14 in the direction $O_1$ by the rotation of the external circulating fan 12.

After the inside hot air and the outside cold air flow into the heat exchange unit 13 of the housing 14 in the different directions $I_1$ and $O_1$, the heat exchange occurs on the channel surfaces of the heat exchange unit 3. Thus, the hot air inducted into the heat exchange unit 13 of the housing 14 in the direction $I_1$ transforms into cold air by heat exchange, and then flows back to the inside of the closed-type electronic apparatus in the direction $I_2$. At the same time, the outside cold air inducted into the heat exchange unit 13 of the housing 14 in the direction $O_1$ transforms into hot air by heat exchange, and then flows out of the housing 14 in the direction $O_2$. In accordance with the heat exchange occurring in the heat exchange unit 13, it provides the efficacy of heat dissipation for the closed-type electronic apparatus.

However, the external circulating fan 12 is disposed in the bottom of the heat exchange device 1. Thus, when the position on which the closed-type electronic apparatus including the heat exchange device 1 locates is flooded with water, the water may leak into the closed-type electronic apparatus through the external circulating fan 12. It damages the external circulating fan 12 and further results in the loss of the heat dissipation function of the heat exchange device 1.

Moreover, because the internal circulating fan 11 and the external circulating fan 12 are disposed at the opposite sides of the heat exchange unit 13, the power line of the external circulating fan 12 and the control circuits connected to the circuit board 11 must pass through the heat exchange unit 13. This is inconvenient for wiring. Additionally, the internal circulating fan 11 and the external circulating fan 12 are disposed on different fixing seats 16 and 17, respectively, which results in the increase of material cost. When both the internal circulating fan 11 and the external circulating fan 12 require maintenance, users have to remove the entire cover 15 to execute the maintenance for the internal circulating fan 11 and the external circulating fan 12 disposed at the different sides, respectively. It is inconvenient for maintenance as well.

SUMMARY OF THE INVENTION

In view of the foregoing, the present invention is to provide a heat exchange device which can be easily maintained, simplify the complexity of wiring, and prevent the damage caused by water leaking in through the external circulating fan, and a closed-type electronic apparatus using the heat exchange device.

The present invention is to provide a heat exchange device with higher efficiency of heat dissipation but a smaller size, and a closed-type electronic apparatus using the heat exchange device.

To achieve the above, a heat exchange device in accordance with the present invention includes a housing, a heat exchange unit, an internal circulating fan and an external circulating fan. The internal circulating fan and the external circulating fan are disposed in the housing and at the same side relative to the heat exchange unit.

To achieve the above, the heat exchange device in accordance with the present invention includes a housing, an internal circulating fan, an external circulating fan and a heat exchange unit. The internal circulating fan and the external circulating fan are disposed in the housing. The heat exchange unit includes two inclined surfaces, and each of the inclined surfaces includes a plurality of vents corresponding to the internal circulating fan and the external circulating fan, respectively.

To achieve the above, a closed-type electronic apparatus in accordance with the present invention includes a housing, an electronic assembly and a heat exchange device. The electronic assembly is disposed in the housing. The heat exchange device is at least partially disposed in the housing and protruded out of the housing.

In one embodiment of the present invention, the heat exchange unit includes a plurality of internal circulating void layers and a plurality of external circulating void layers disposed interlacingly, and channels of the internal circulating void layers are not connected to channels of the external circulating void layer.

In one embodiment of the present invention, each of the internal circulating void layers includes an inlet and an outlet disposed at two sides of the heat exchange unit, respectively. Each of the external circulating void layers includes an inlet and an outlet disposed at two sides of the heat exchange unit, respectively.

In one embodiment of the present invention, the heat exchange unit further includes two inclined surfaces. The inlets of the internal circulating void layers are disposed on one of the inclined surfaces, and the inlets or the outlets of the external circulating void layers are disposed on the other one of the inclined surfaces.

In one embodiment of the present invention, the internal circulating void layers and the external circulating void layers are substantially hollow pentagonal-shaped in a laterally cross-sectional view.

In one embodiment of the present invention, air flows generated by the rotations of the internal circulating fan and the external circulating fan, respectively, are in the same direction or in opposing directions.

In one embodiment of the present invention, the internal circulating fan and the external circulating fan can be individual fans, or the internal circulating fan and the external circulating fan are disposed coaxially to rotate simultaneously.

In summary, the internal circulating fan and the external circulating fan of the heat exchange device in accordance with the present invention are disposed at the same side relative to the heat exchange unit. In other words, because both the internal circulating fan and the external circulating fan can be disposed in the top of the heat exchange device, the heat exchange device of the present invention can prevent the damage caused by water leaking through the external circulating fan. In addition, the wiring configurations such as the control circuit and the power wire can avoid passing through the heat exchange unit due to that the internal circulating fan and the external circulating fan are disposed at the same side relative to the heat exchange unit, so that the complexity of wiring can be simplified. Moreover, when the internal circulating fan and the external circulating fan require maintenance, users just have to remove the cover at one side and then can execute the maintenance on both the internal circulating fan and the external circulating fan, simultaneously. It is more convenient for maintaining the heat exchange device of the present invention.

In addition, the heat exchange unit of the heat exchange device in accordance with the present invention can include two inclined surfaces corresponding to the internal circulating fan and the external circulating fan, respectively, and the inlets of the internal circulating void layers and the inlets or outlets of the external circulating void layers are disposed on the different inclined surfaces, respectively. Therefore, this configuration can expand the surface area of the vents and thereby increases the amounts of the inward and outward air flows. Consequentially, it promotes the efficiency of the heat dissipation of the heat exchange device in accordance with the present invention.

Furthermore, since both the internal circulating fan and the external circulating fan are disposed at the same side relative to the heat exchange device, it promotes the efficiency of heat dissipation of the heat exchange device. Alternatively, the heat exchange device of the present invention can achieve the same level of the efficiency of heat dissipation with a smaller size.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
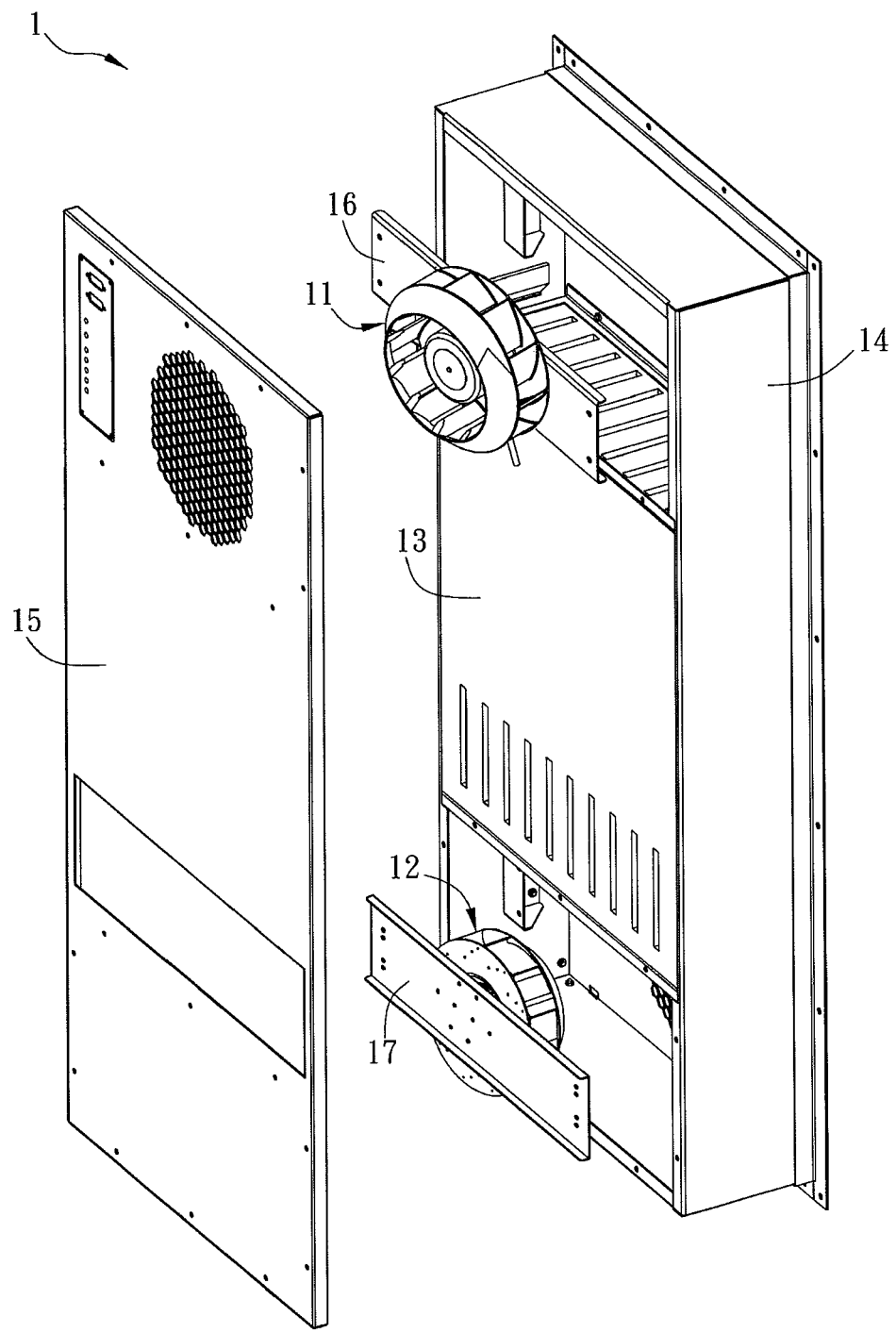
FIG. 1A is a decomposition figure of a conventional heat exchange device.
Figure 1B:
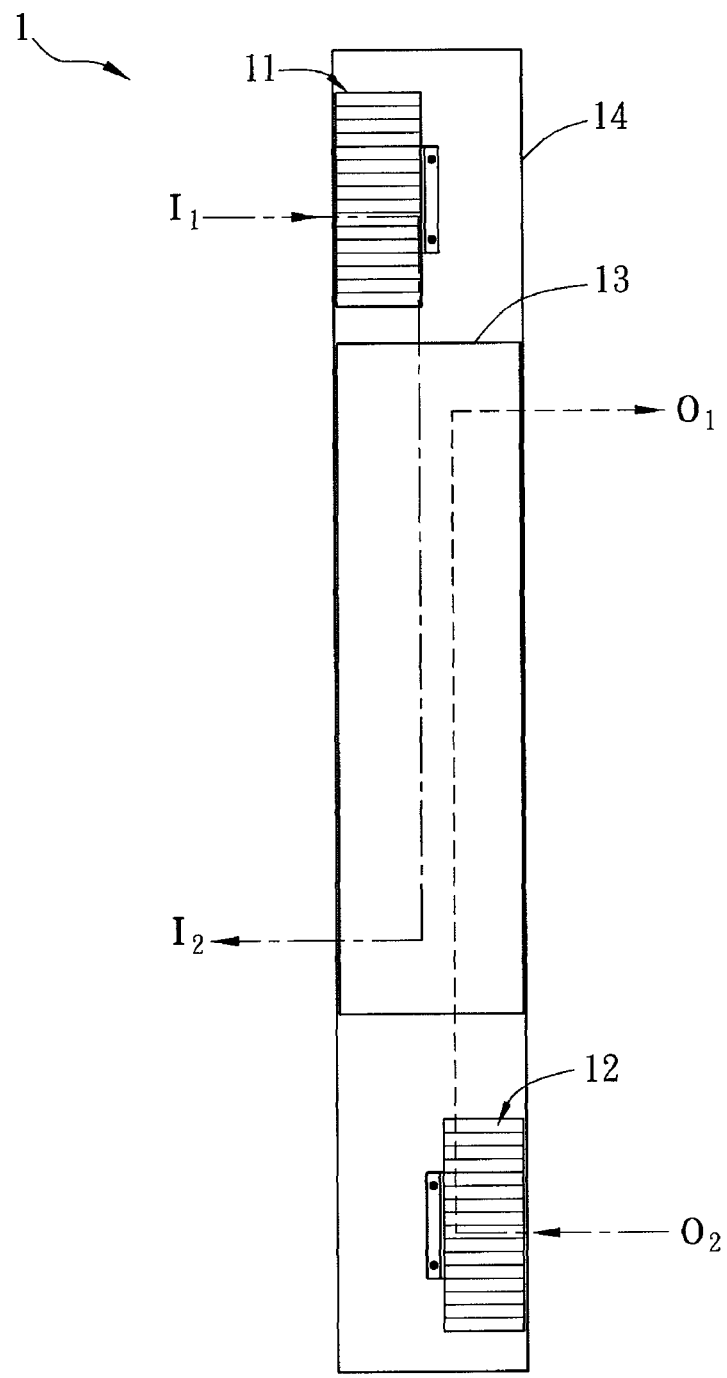
FIG. 1B is a laterally cross-sectional figure of the heat exchange device shown in FIG. 1A.
Figure 2A:
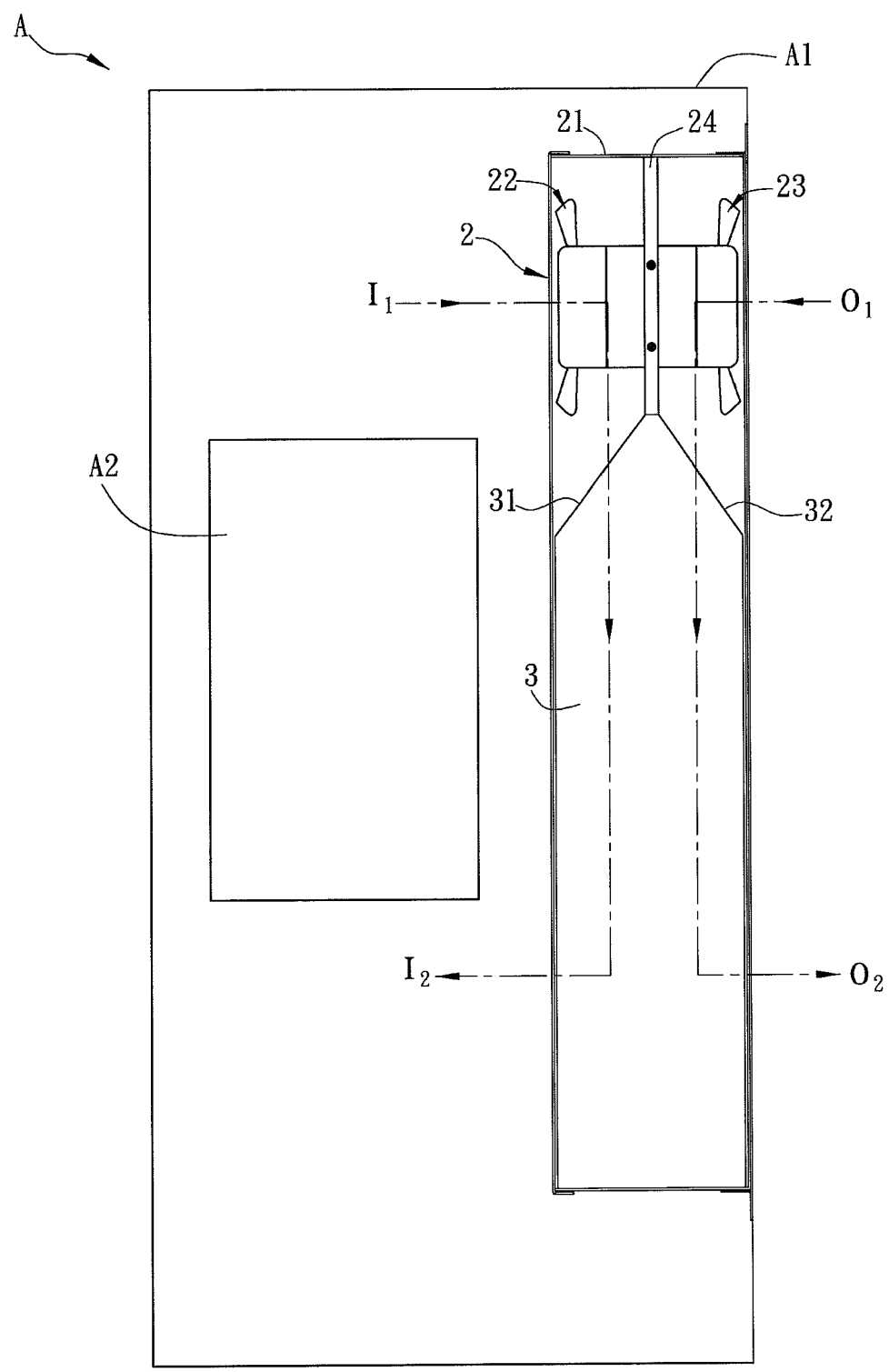
FIG. 2A is a laterally cross-sectional figure of a closed-type electronic apparatus of a preferred embodiment in accordance with the present invention.
Figure 2B:
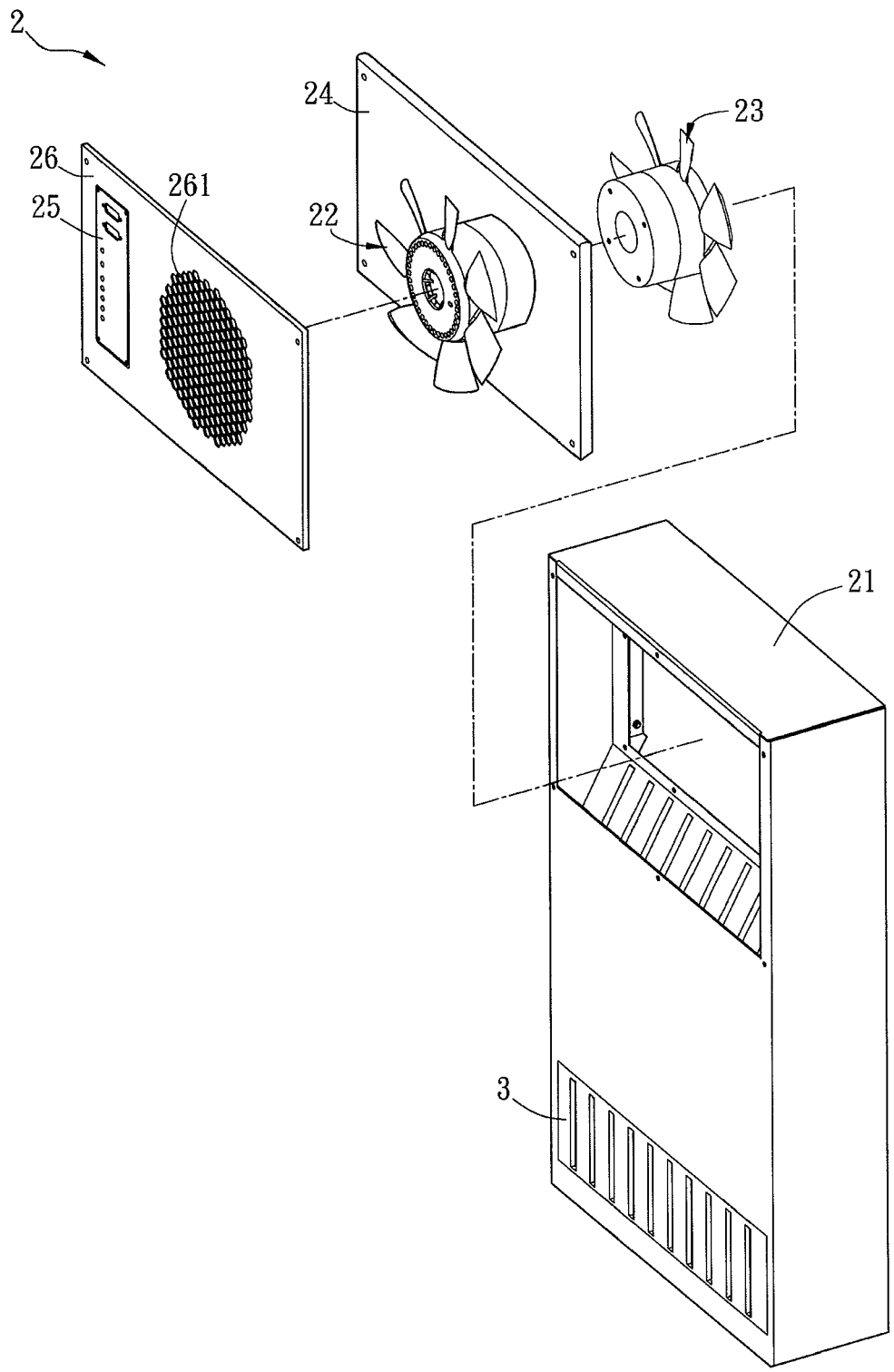
FIG. 2B is a decomposition figure of the heat exchange device of the preferred embodiment in accordance with the present invention.

FIG. 2A is a laterally cross-sectional figure of a closed-type electronic apparatus A of a preferred embodiment in accordance with the present invention, and FIG. 2B is a decomposition figure of a heat exchange device 2 of the preferred embodiment in accordance the present invention. The closed-type electronic apparatus A can be, for example, a server apparatus or other large closed-type electronic apparatuses.

As shown in FIG. 2A, the closed type apparatus A includes a housing A1, an electronic assembly A2 and a heat exchange device 2. The electronic assembly A2 is disposed in the housing A1. Because the electronic assembly A2 generates heat in operation, it is necessary to apply the heat exchange device 2 of the present invention to dissipate the undesired heat. To be noted, the electronic assembly A2 shown in FIG. 2A is for easily schematic illustration, and, in practice, it can be with different configurations corresponding to the closed-type electronic apparatuses A with different functions.

The heat exchange device 2 is at least partially disposed in the housing A1 and protruded out of the housing A1. In the present embodiment, the heat exchange device 2 is, for example but not limited to, disposed entirely in the housing A1.

As shown in FIGS. 2A and 2B, the heat exchange device 2 includes a housing 21, an internal circulating fan 22, an external circulating fan 23 and a heat exchange unit 3.

The material and the shape of the housing 21 are not limited. In addition, an internal circulating channel and an external circulating channel are formed in the housing 21 by the disposition of the heat exchange unit 3. The internal circulating channel is a circulating channel for the hot air inside the housing A1 of the closed-type electronic apparatus A to flow through the heat exchange unit 3 for heat dissipation, and the external circulating channel is a circulating channel for the cold air outside the housing A1 of the closed-type electronic apparatus A to flow through the heat exchange unit 3 to absorb heat and then be exhausted to the outside.

The internal circulating fan 22 is disposed in the housing 21 and located in the internal circulating channel. The internal circulating fan 22 can be, for example, an axial-flow fan or a centrifugal fan. In more detailed, the centrifugal fan can further be a cross-flow fan or a diagonal-flow fan. The internal circulating fan 22 described herein is, for example but not limited to, an axial-flow fan.

The external circulating fan 23 is disposed in the housing 21, and located in the external circulating channel. The external circulating fan 23 can be for example an axial-flow fan or a centrifugal fan. In more detailed, the centrifugal fan can further be a cross-flow fan or a diagonal-flow fan. The external circulating fan 23 described herein is, for example but not limited to, an axial-flow fan. Additionally, the internal circulating fan 22 and the external circulating fan 23 are disposed at the same side relative to the heat exchange unit 3. The side described in the present embodiment is, for example but not limited to, the top side.

Figure 3:
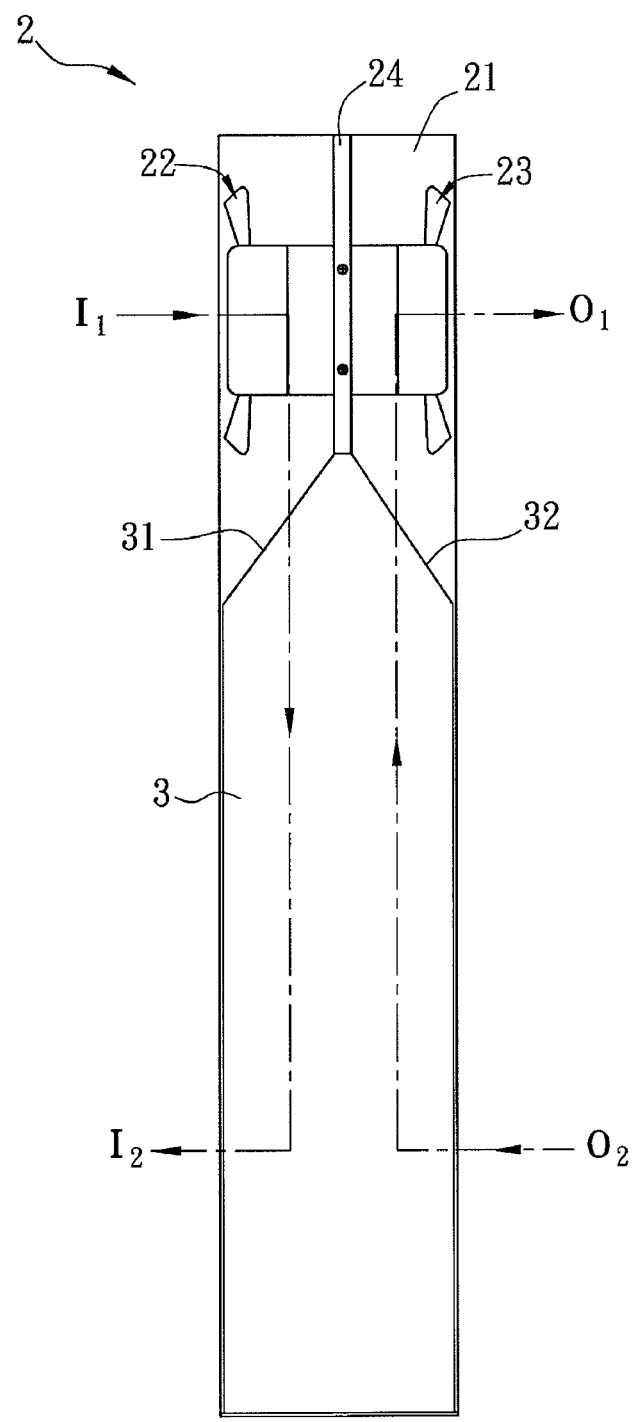
FIG. 3 is laterally cross-sectional figure of the heat exchange device of another aspect of the preferred embodiment in accordance with the present invention.

To be noted, as shown in FIGS. 2A and 3, the air flows generated by the rotations of the internal circulating fan 22 and the external circulating fan 23, respectively, can be in the same direction or in opposing directions. In other words, because hot air always flows upward in air convection, the direction of the air flow generated by the rotation of the internal circulating fan 22 is consequentially a suction direction $I_1$. However, as shown in FIGS. 2A and 3, the direction of the air flow generated by the external circulating fan 23 can be transformed alternatively between a suction direction (from $O_1$ to $O_2$) and an exhaust direction (from $O_2$ to $O_1$) by different alignments or different rotation direction of the blades of the external circulating fan 23.

Figure 4A:
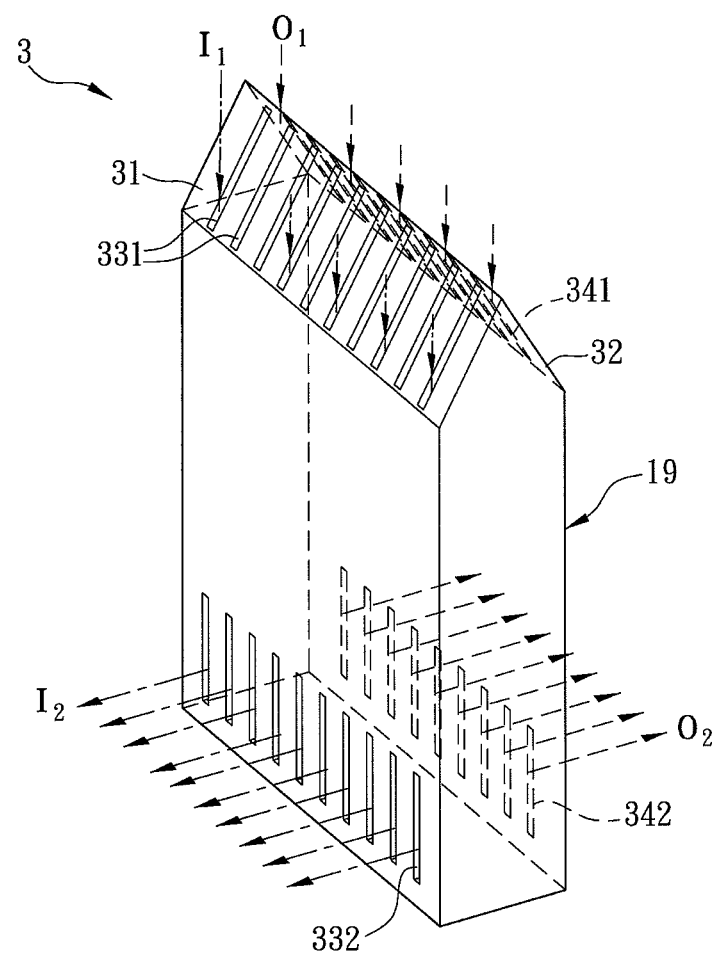
FIG. 4A is a schematic figure of a heat exchange unit of the preferred embodiment in accordance with the present invention.
Figure 4B:
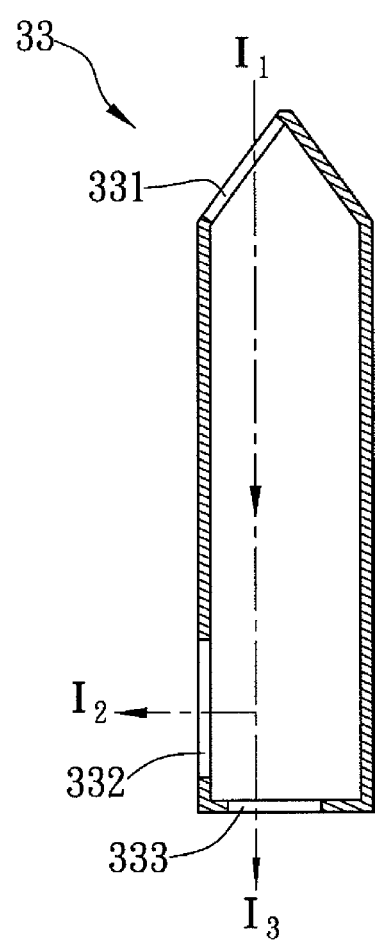
FIGS. 4B and 4C are different cross-sectional figures of the heat exchange unit shown in FIG. 4A.

The heat exchange unit 3 is disposed in the housing 21. The material of the heat exchange unit 3 can be for example aluminum, copper or other material with a high coefficient of thermal conductivity. FIG. 4A is a schematic figure of the heat exchange unit 3 of the present embodiment, and FIGS. 4B and 4C are different cross-sectional figures of the heat exchange unit 3.

Figure 4C:
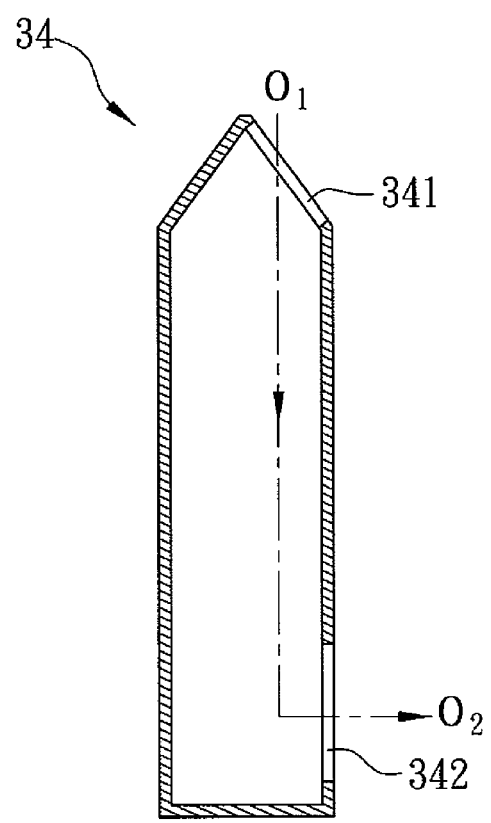

As shown in FIGS. 2A, 4A and 4C, in the present embodiment, a side view of the heat exchange unit 3 (shown in FIGS. 4B and 4C) can include, for example but not limited to, two inclined surfaces 31 and 32. In this case, the inclined surfaces 31 and 32 are not necessary to be flat surfaces, and can be curved surfaces, arc surfaces or other regular or irregular surfaces. The heat exchange unit 3 can further include a plurality of internal circulating void layers 33 and a plurality of external circulating void layers 34, which are disposed interlacingly. Additionally, channels of the internal circulating void layers are not connected to channels of the external circulating void layer. In other words, the heat exchange unit 3 is formed by the interlacing dispositions of the internal circulating void layers 33 shown in FIG. 4B and the external circulating void layers 34 shown in FIG. 4C, and the channels of the internal circulating void layers are separated from the channels of the external circulating void layer by fins. Therefore, the adjacent internal circulating void layer 33 and external circulating void layer 34 belong to different circulating channels. Moreover, a laterally cross-sectional view (as cross-sectional views shown in FIGS. 4B and 4C) of the internal circulating void layers 33 and the external circulating void layers 34 are substantially, for example but not limited to, hollow pentagonal-shaped. To be noted, the substantially hollow pentagonal-shaped void layers represents their inclined surfaces 31 and 32 can be curved surfaces or arc surfaces.

To be noted, the heat exchange unit 3 can be formed by the combination of the internal circulating void layers 33 and the external circulating void layers 34, which are individually formed in advance. Alternatively, the case of the heat exchange unit 3 can be formed first, and then the heat exchange unit 3 is formed by using the fins to separate the internal circulating void layers 33 and the external circulating void layers 34.

Each of the internal circulating void layers 33 includes an inlet 331 and at least one outlet 332 disposed at two sides of the heat exchange unit 3, respectively, and an outlet 333 can be disposed at the bottom of the internal circulating void layer 33. The outlets 332 and 333 can be alternatively or simultaneously disposed. Each of the external circulating void layers 34 includes an inlet 341 and an outlet 342 disposed at two sides of the heat exchange unit 3, respectively. The inlets 331 of the internal circulating void layers 33 are disposed on one of the inclined surfaces such as the inclined surface 31, and, as shown in FIG. 3, the inlets 341 or the outlets of the external circulating void layers 34 are disposed on the other one of the inclined surfaces such as the inclined surface 32.

As shown in FIG. 2A, in the present embodiment, the inlets 331 of the internal circulating void layers 33 and the inlets 341 of the external circulating void layers 34 are disposed at the same side relative to the heat exchange unit 3, and correspond to the internal circulating fan 22 and the external circulating fan 23, respectively. Alternatively, as shown in FIG. 3, the inlets of the internal circulating void layers and the outlets of the external circulating void layers are disposed at the same side relative to the heat exchange unit 3, and correspond to the internal circulating fan 22 and the external circulating fan 23, respectively.

As shown in FIG. 2B, in the present embodiment, the heat exchange device 2 can further include, for example but not limited to, a fixing element 24, a control unit 25 and a cover 26.

The fixing element 24 and the housing 21 can be formed as one piece, and the internal circulating fan 22 and the external circulating fan 23 are disposed at opposing sides of the fixing element 24, respectively. To be noted, the fixing element 24 is not an essential element and, alternatively, the frames of the internal circulating fan 22 and the external circulating fan 23 can be fixed on the housing 21 directly so as to separate the internal circulating channels and the external circulating channels.

The control unit 25 can be for example a circuit board, and electrically connected to the internal circulating fan 22 and the external circulating fan 23. The control unit 25 can be used to control the rotation directions and/or the rotational speeds of the internal circulating fan 22 and the external circulating fan 23. Furthermore, in order to remove the accumulated dust, the control unit 25 can control the internal circulating fan 22 and the external circulating fan 23 to rotate in a reverse direction opposite to the normal rotation direction for heat exchange. In other words, the internal circulating fan 22 and the external circulating fan 23 rotate for example clockwise for heat exchange and rotate counterclockwise for dust removal.

The cover 26 includes a plurality of openings 261 corresponding to the internal circulating fan 22, and the housing 21 is closed by the cover 26. The combination method can be, for example but not limited to, adhesion, locking, screwing, mounting or wielding. Herein, the cover 26 is, for example, locked on the housing 26.

Therefore, as shown in FIGS. 2A and 4A, the hot air inside the closed-type electronic apparatus A is inducted into the heat exchange unit 3 in the direction $I_1$ when the internal circulating fan 22 is rotating. Meanwhile, the outside cold air is also inducted into the heat exchange unit 3 in the direction $O_1$. After the inside hot air and the outside cold air flow into the heat exchange unit 3 in the different directions $I_1$ and $O_1$, the heat exchange occurs in the heat exchange unit 3. Thus, the inside hot air transforms into cold air and then flows back to the inside of the closed-type electronic apparatus A in the direction $I_2$, and the outside cold air transforms into hot air and is then exhausted to the outside in the direction $O_2$. Accordingly, it provides the efficacy of heat dissipation for the closed-type electronic apparatus A.

Because both the internal circulating fan 22 and the external circulating fan 23 of the heat exchange device 2 are disposed in the top of the heat exchange unit 3, the heat exchange device 2 of the present embodiment can prevent the damage caused by water leaking in through an external circulating fan 23. In addition, the wiring such as the control circuit and the power wire can avoid passing through the heat exchange unit 3 due to that the internal circulating fan 22 and the external circulating fan 23 are disposed at the same side relative to the heat exchange unit 3. It simplifies the complexity of wiring.

Additionally, when the internal circulating fan 22 and the external circulating fan 23 require maintenance, users just have to remove the cover 26 at one side and then execute the maintenance on both the internal circulating fan 22 and the external circulating fan 23, simultaneously. It is more convenient for maintaining the heat exchange device 2 of the present invention.

Additionally, the heat exchange unit 3 of the heat exchange device 2 of the present embodiment includes two inclined surfaces 31 and 32 corresponding to the internal circulating fan 22 and the external circulating fan 23, respectively. As shown in FIGS. 4A and 4C, inlets 331 of the internal circulating void layers 33 and inlets 341 or outlets of the external circulating void layers 34 are disposed at the different inclined surfaces 31 and 32. Therefore, as shown in FIG. 2A, it expands the surface area of the vents and thereby increases the amounts of inward and outward air flows. Consequentially, it promotes the efficiency of the heat dissipation of the heat exchange device 2 of the present embodiment. Furthermore, since both the internal circulating fan 22 and the external circulating fan 23 are disposed at the same side relative to the heat exchange device 2, it promotes the efficiency of heat dissipation of the heat exchange device 2. Alternatively, the heat exchange device 2 of the present invention can achieve the same level of the efficiency of heat dissipation with a smaller size.

Figure 5:
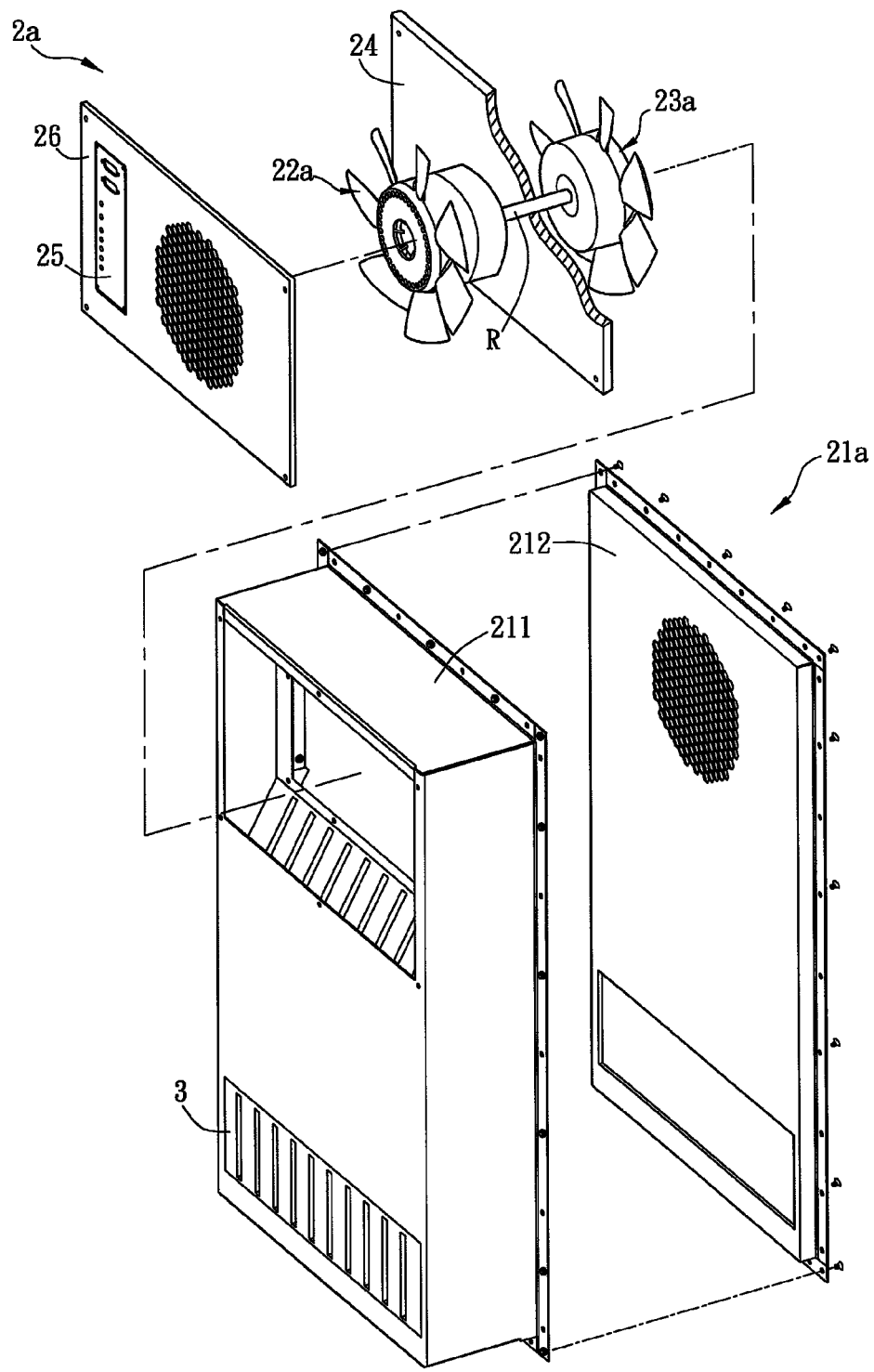
FIG. 5 is a decomposition figure of the heat exchange device of another aspect of the preferred embodiment in accordance with the present invention.

FIG. 5 is decomposition figure of the heat exchange device 2a in accordance with another aspect of the present embodiment. The difference between the present embodiment and the aforementioned embodiment is that the internal circulating fan 22a and the external circulating fan 23a are disposed coaxially. In other words, the internal circulating fan 22a and the external circulating fan 23a share a single rotation shaft R. Therefore, the internal circulating fan 22a and the external circulating fan 23a can be driven by just a motor such that it reduces the amount of the elements and the product cost of the heat exchange device 2a. To be noted, as shown in FIGS. 2A and 3, when the internal circulating fan 22a and the external circulating fan 23a rotate coaxially, the directions of the air flows generated by the internal circulating fan 22a and the external circulating fan 23a can be the same or opposite by disposing different blades used in the internal circulating fan 22a and the external circulating fan 23a.

Additionally, the housing 21a can be formed by two sub-housings 211 and 212, and the two sub-housings 211 and 212 can be combined by for example adhesion, locking, screwing, mounting or wielding. The sub-housings 211 and 212 described herein are combined, for example, by locking. In the present embodiment, the margins of the sub-housing 211 are folded outward at a 90 degree angle to form fixing portions, and the fixing portions includes a plurality of circular holes and a plurality of studs. Similarly, the margins of the sub-housing 212 are formed as fixing portions as well, and the fixing portions include circular holes. The circular holes of the sub-housing 212 correspond to the positions of the stubs of the sub-housing 211 such that the sub-housings 211 and 212 can be combined with each other by screw locking.

To be noted, the heat exchange device 2a shown in FIG. 5 can be applied to the closed-type electronic apparatus A shown in FIG. 2A as well.

In summary, because both the internal circulating fan 22 and the external circulating fan 23 are disposed in the top of the heat exchange device 2, the heat exchange device 2 of the present embodiment can prevent the damage caused by water leaking in through the external circulating fan 23. In addition, the wiring configurations such as the control circuit and the power wire can avoid passing through the heat exchange unit 3 due to that the internal circulating fan 22 and the external circulating fan 23 are disposed at same side relative to the heat exchange unit 3, so that the complexity of wiring can be simplified.

Moreover, the heat exchange unit of the heat exchange device in accordance with the present invention can include two inclined surfaces corresponding to the internal circulating fan and the external circulating fan, respectively, and the inlets of the internal circulating void layers and the inlets or the outlets of the external circulating void layers are disposed on the different inclined surfaces, respectively. Therefore, this configuration can expand the surface area of the vents and thereby increases the amounts of the inward and outward air flows. Consequentially, it promotes the efficiency of the heat dissipation of the heat exchange device in accordance with the present embodiment.

Furthermore, since both the internal circulating fan and the external circulating fan are disposed at the same side relative to the heat exchange device, it promotes the efficiency of heat dissipation of the heat exchange device. Alternatively, the heat exchange device can achieve the same level of the efficiency of heat dissipation with a smaller size.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat exchange device, comprising:
   a housing;
   an internal circulating fan disposed in the housing;
   an external circulating fan disposed in the housing; and
   a heat exchange unit disposed in the housing, wherein the internal circulating fan and the external circulating fan are disposed at the same side relative to the heat exchange unit,
   wherein the heat exchange unit comprises a plurality of internal circulating void layers and a plurality of external circulating void layers disposed interlacingly.

2. The heat exchange device of claim 1, further comprising:
   a fixing element, wherein the internal circulating fan and the external circulating fan are disposed at opposing sides of the fixing element, respectively.

3. The heat exchange device of claim 1, wherein channels of the internal circulating void layers are not connected to channels of the external circulating void layers.

4. The heat exchange device of claim 1, wherein each of the internal circulating void layers comprises an inlet and an outlet disposed at two sides of the heat exchange unit, respectively.

5. The heat exchange device of claim 4, wherein each of the external circulating void layers comprises an inlet and an outlet disposed at two sides of the heat exchange unit, respectively.

6. The heat exchange device of claim 5, wherein the heat exchange unit further comprises two inclined surfaces, the inlets of the internal circulating void layers are disposed on one of the inclined surfaces, and the inlets or the outlets of the external circulating void layers are disposed on the other one of the inclined surfaces.

7. The heat exchange device of claim 5, wherein the inlets of the internal circulating void layers and the inlets of the external circulating void layers are disposed at the same side relative to the heat exchange unit, and correspond to the internal circulating fan and the external circulating fan, respectively.

8. The heat exchange device of claim 5, wherein the inlets of the internal circulating void layers and the outlets of the external circulating void layers are disposed at the same side of the heat exchange unit, and correspond to the internal circulating fan and the external circulating fan, respectively.

9. The heat exchange device of claim 1, wherein the internal circulating void layers and the external circulating void layers are substantially hollow pentagonal-shaped.

10. The heat exchange device of claim 1, wherein air flows generated by the rotations of the internal circulating fan and the external circulating fan, respectively, are in the same direction or in opposing directions.

11. The heat exchange device of claim 1, wherein the internal circulating fan and the external circulating fan are disposed coaxially.

12. The heat exchange device of claim 11, wherein air flows generated by the rotations of the internal circulating fan and the external circulating fan, respectively, are in the same direction or in opposing directions when the internal circulating fan and the external circulating fan rotate coaxially.

13. The heat exchange device of claim 1, wherein the internal circulating fan and the external circulating fan are axial-flow fans or centrifugal fans.

14. The heat exchange device of claim 1, further comprising:
a control unit electrically connected to the internal circulating fan and the external circulating fan.

15. A heat exchange device, comprising:
a housing;
an internal circulating fan disposed in the housing;
an external circulating fan disposed in the housing; and
a heat exchange unit disposed in the housing and comprising two inclined surfaces, wherein each of the inclined surfaces comprises a plurality of vents corresponding to the internal circulating fan and the external circulating fan, respectively,
wherein the heat exchange unit comprises a plurality of internal circulating void layers and a plurality of external circulating void layers disposed interlacingly.

16. The heat exchange device of claim 15, wherein the internal circulating fan and the external circulating fan are disposed at the same side relative to the heat exchange unit.

17. The heat exchange device of claim 15, wherein channels of the internal circulating void layers are not connected to channels of the external circulating void layers.

18. The heat exchange device of claim 15, wherein each of the internal circulating void layers comprises an inlet and an outlet disposed at two sides of the heat exchange unit.

19. The heat exchange device of claim 18, wherein each of the external circulating void layers comprises an inlet and an outlet disposed at two sides of the heat exchange unit.

20. The heat exchange device of claim 19, wherein the vents disposed on one of the inclined surfaces are the inlets of the internal circulating void layers, and the other vents disposed on the other one of the inclined surfaces are the inlets or the outlets of the external circulating void layers.

21. The heat exchange device of claim 19, wherein the inlets of the internal circulating void layers and the inlets of the external circulating void layers are disposed at the same side relative to the heat exchange unit, and correspond to the internal circulating fan and the external circulating fan, respectively.

22. The heat exchange device of claim 19, wherein the inlets of the internal circulating void layers and the outlets of the external circulating void layers are disposed at the same side of the heat exchange unit, and correspond to the internal circulating fan and the external circulating fan, respectively.

23. The heat exchange device of claim 15, wherein the internal circulating void layers and the external circulating void layers are substantially hollow pentagonal-shaped.

24. The heat exchange device of claim 15, wherein air flows generated by the rotations of the internal circulating fan and the external circulating fan, respectively, are in the same direction or in opposing directions.

25. The heat exchange device of claim 15, wherein the internal circulating fan and the external circulating fan are disposed coaxially.

26. The heat exchange device of claim 25, wherein air flows generated by the rotations of the internal circulating fan and the external circulating fan, respectively, flow in the same direction or in opposing directions when the internal circulating fan and the external circulating fan rotate coaxially.

27. A heat exchange device, comprising:
a housing;
an internal circulating fan disposed in the housing;
an external circulating fan disposed in the housing; and
a heat exchange unit disposed in the housing, wherein the internal circulating fan and the external circulating fan are disposed at the same side relative to the heat exchange unit,
wherein the internal circulating fan and the external circulating fan are disposed coaxially,
wherein the heat exchange unit comprises a plurality of internal circulating void layers and a plurality of external circulating void layers disposed interlacingly.

28. A heat exchange device, comprising:
a housing;
an internal circulating fan disposed in the housing;
an external circulating fan disposed in the housing; and
a heat exchange unit disposed in the housing and comprising two inclined surfaces, wherein each of the inclined surfaces comprises a plurality of vents corresponding to the internal circulating fan and the external circulating fan, respectively,
wherein the internal circulating fan and the external circulating fan are disposed coaxially,
wherein the heat exchange unit comprises a plurality of internal circulating void layers and a plurality of external circulating void layers disposed interlacingly.

* * * * *